(12) United States Patent
Chen et al.

(10) Patent No.: US 8,624,628 B1
(45) Date of Patent: Jan. 7, 2014

(54) ADJUSTABLE LEVEL SHIFTER

(75) Inventors: Ming Chen, Shanghai (CN); Shu Dong Cheng, Nanjing (CN)

(73) Assignee: Agere Systems LLC, Allentown, PA (US)

( * ) Notice: Subject to any disclaimer, the term of this patent is extended or adjusted under 35 U.S.C. 154(b) by 0 days.

(21) Appl. No.: 13/568,227

(22) Filed: Aug. 7, 2012

(51) Int. Cl.
*H03K 19/0175* (2006.01)

(52) U.S. Cl.
USPC .......... 326/80; 326/82; 326/83; 327/333; 327/562

(58) Field of Classification Search
USPC .............. 326/60–81; 327/333, 592
See application file for complete search history.

(56) References Cited

U.S. PATENT DOCUMENTS

| | | | |
|---|---|---|---|
| 4,150,308 A | 4/1979 | Adlhoch | |
| 5,532,619 A | 7/1996 | Bonaccio | |
| 5,623,230 A | 4/1997 | Goldthorp | |
| 5,825,229 A | 10/1998 | Manaresi et al. | |
| 6,005,439 A * | 12/1999 | Fong | 330/253 |
| 6,222,385 B1 | 4/2001 | Kang | |
| 6,259,299 B1 | 7/2001 | Ryu | |
| 6,696,869 B1 * | 2/2004 | Tan | 327/108 |
| 7,551,017 B2 * | 6/2009 | Felder | 327/333 |
| 2004/0104767 A1 * | 6/2004 | Prexl et al. | 329/347 |
| 2005/0046495 A1 * | 3/2005 | Li | 331/57 |
| 2006/0002483 A1 | 1/2006 | Kim | |
| 2007/0008001 A1 | 1/2007 | Sanchez et al. | |

* cited by examiner

*Primary Examiner* — Shawki Ismail
*Assistant Examiner* — Dylan White

(57) ABSTRACT

Described embodiments include a level shifter that provides a voltage level shift to applied signals, the amount of voltage shift being accurately controlled and independent of PVT. The level shifter has first transistor configured as a voltage follower with the gate coupled to an input terminal of the shifter and the source coupled to a node, a diode-connected transistor coupled between the node and an output terminal of the circuit, a first controlled current source coupled to the node, and a second controlled current source coupled to the output terminal. A controller receives a bandgap-stabilized voltage, squares the stabilized voltage to produce a control signal that controls the first and second controlled current sources. The voltage shift is proportional to a digitally-controlled scale factor (K) times the stabilized voltage. The ratio of the current from the first current source to the second current source is (K+1)/K.

19 Claims, 4 Drawing Sheets

ADJUSTABLE LEVEL SHIFTER

BACKGROUND OF THE INVENTION

Many integrated circuit designs use multiple power supplies to reduce power consumption while still providing high performance. But the voltage levels of logic signals processed by logic circuitry powered by one power supply domain might be different, and possibly incompatible, with the voltage levels of logic signals processed by logic powered by different power supply domain. For example, a field-programmable gate array (FPGA) typically has core signal processing logic and input-output buffers interfacing the core logic with off-chip logic circuitry. Generally, the input-output buffers are powered from one or more power supplies having voltages higher than the power supplies powering the core logic. Because the voltage levels of logic signals for the input-output buffers are usually greater than the voltage levels of logic signals utilized by the core logic, level shifters are used to "translate" the logic signals passing between the core logic and the input-output buffers.

A similar use for level shifters exists in analog circuitry where it is desirable to shift the level of analog signals originating from one analog function for use by another analog function. For example, a phase-locked-loop (PLL) might require the use of a level shifter to have an error signal from a phase detector shifted to a voltage range that is suitable for use by a voltage-controlled oscillator (VCO).

Two similar examples of a level shifter used to change the voltage levels of logic or analog signals are source or emitter followers where the output voltage levels are reduced by an amount approximately equal to the gate-to-source voltage or base-to-emitter voltage of a single MOSFET or bipolar transistor, respectively. Because the amount of voltage reduction is dependent on the electrical characteristics of the transistor, the amount of voltage reduction is relatively large (e.g., 0.5-0.7 volts), is not controllable, and varies with process, temperature, and operating voltage.

SUMMARY OF THE INVENTION

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Described embodiments provide a level shifting circuit comprising first and second transistors and first and second controlled current sources. The first transistor has a control terminal coupled to an input terminal of the level shifting circuit, a first controlled terminal, and a second controlled terminal coupled to a first node. The second transistor has a first controlled terminal coupled to an output terminal of the level shifting circuit, a second controlled terminal coupled to the first node, and a control terminal coupled to the first controlled terminal of the second transistor. The first controlled current source is coupled to the node and the second controlled current source is coupled to the first controlled terminal of the second transistor. The current from the first controlled current source and current from the second current source are substantially independent of signals applied to the input terminal.

BRIEF DESCRIPTION OF THE DRAWINGS

Other embodiments of the present invention will become more fully apparent from the following detailed description, the appended claims, and the accompanying drawings in which like reference numerals identify similar or identical elements.

DETAILED DESCRIPTION

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation".

It should be understood that the steps of the exemplary methods set forth herein are not necessarily required to be performed in the order described, and the order of the steps of such methods should be understood to be merely exemplary. Likewise, additional steps might be included in such methods, and certain steps might be omitted or combined, in methods consistent with various embodiments of the present invention.

Also for purposes of this description, the terms "couple", "coupling", "coupled", "connect", "connecting", or "connected" refer to any manner known in the art or later developed in which energy is allowed to be transferred between two or more elements, and the interposition of one or more additional elements is contemplated, although not required. Conversely, the terms "directly coupled", "directly connected", etc., imply the absence of such additional elements. Signals and corresponding nodes or ports might be referred to by the same name and are interchangeable for purposes here. The term "or" should be interpreted as inclusive unless stated otherwise.

The present invention will be described herein in the context of illustrative embodiments of a level shifter adapted to be for use in an integrated circuit or the like. It is to be appreciated, however, that the invention is not limited to the specific apparatus and methods illustratively shown and described herein. Rather, aspects of the invention are directed broadly to techniques for beneficially providing a level shifter with a controllable voltage drop compatible with complementary metal-oxide-semiconductor technology (CMOS) or bipolar technology.

Figure 1:
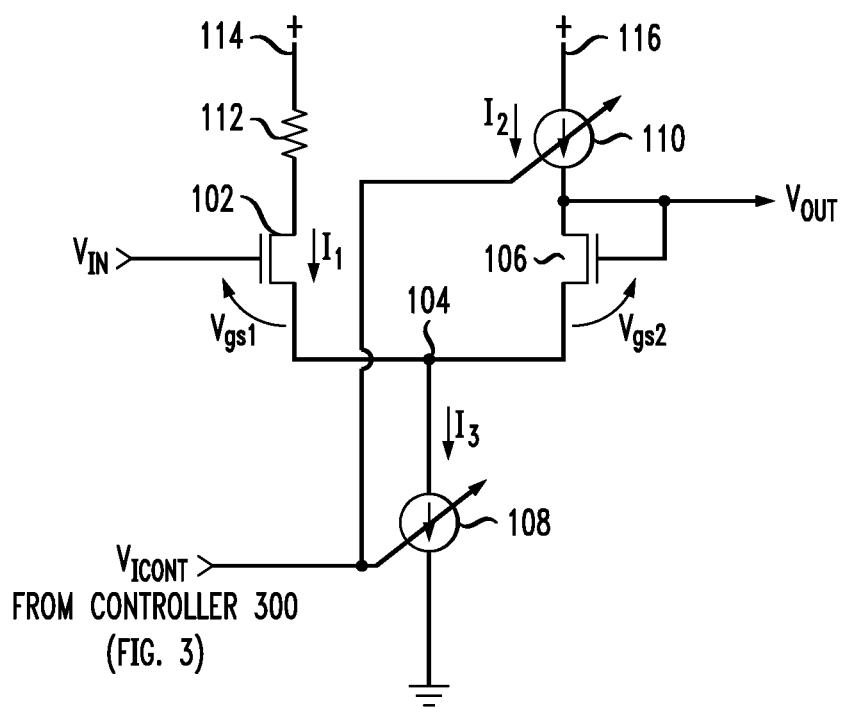
FIG. 1 is a simplified schematic diagram illustrating an exemplary level translator according to an embodiment of the invention.

In FIG. 1, a block diagram of an exemplary level shifter 100 implemented using CMOS, although the level shifter 100 may be implemented using bipolar technology or using a combination of bipolar technology and CMOS technology known as bi-CMOS technology. A first transistor 102, operating as a voltage follower, has a gate terminal coupled to an input $V_{in}$ of the level shifter and a source terminal coupled to a common node 104. A second transistor 106 has a source terminal coupled to the node 104 and a drain terminal coupled to an output $V_{out}$ of the level shifter. The gate terminal of the second transistor 106 also couples to the drain terminal of the transistor 106, to form a diode-connected transistor 106. A first current source 108 couples to node 104 and a second current source 110 couples to the drain and gate of the transistor 106. As will be explained in more detail below, the current sources 108 and 110 are controlled by a common control signal $V_{ICONT}$ that serves to control the currents passed by the current sources. In one embodiment, the current passed by current source 108 to that passed by current source 110 is approximately equal to (K+1)/K, where K is a scalar value greater than zero. For example, the current passed by source 110 is proportional to K times a function of $V_{ICONT}$ and the current passed by current source 108 is proportional to (K+1) times a function of $V_{ICONT}$, the function of $V_{ICONT}$ being that of the gate-to-source voltage to drain current transfer characteristic of a MOSFET as explained below. In an alternative embodiment, the two current sources are controlled independently. In either embodiment, neither current source provides a current that follows the input signal applied to input $V_{in}$, except for variations resulting from imperfections in the current source itself. It is also understood that the currents from the sources might be adjusted to suit the input voltage range of signals being applied to input $V_{in}$.

The transistors 102, 106 serve to first reduce then increase a voltage applied to the input $V_{in}$ such that a voltage on the output Vout is offset or shifted by a voltage $\Delta V$ from the voltage on the input Vin. The amount of shift is related to the currents passed by the current sources 108 and 110. This is understood by recognizing that the current passed (drain current) by a MOSFET is approximately $$C_{ox} \frac{\mu}{2} \frac{W}{L} (V_{gs} - V_t)^2 \qquad (\text{Eq. 1})$$

where is $C_{ox}$ being the gate oxide capacitance, $\mu$ the channel mobility, and $$\frac{W}{L}$$

the channel width-to-length ratio, $V_{gs}$ the gate-to-source voltage, and $V_t$ the threshold voltage. Assuming current $I_1$ is passed by transistor 102, $I_2$ (the current supplied by current source 110) is passed by transistor 106, and $I_3$ is the current through current source 108, then $$I_3 = I_1 + I_2. \qquad (\text{Eq. 2})$$

The voltage shift $\Delta V$ by the level shifter is determined by the difference between the gate-to-source voltages of transistors 102 (here $V_{gs1}$) and transistor 106 (here $V_{gs2}$):

$$\Delta V = V_{out} - V_{in} = V_{gs2} - V_{gs1} \qquad (\text{Eq. 3})$$

Rewriting Eq. 1 to solve for gate-to-source voltages and substituting it into Eq. 3 and assuming that transistors 102 and 106 are substantially matched results in:

$$\Delta V = \sqrt{\frac{I_2}{C_{ox} \frac{\mu}{2} \frac{W}{L}}} - \sqrt{\frac{I_1}{C_{ox} \frac{\mu}{2} \frac{W}{L}}} \qquad (\text{Eq. 4})$$

or $$\Delta V = \sqrt{\frac{1}{C_{ox} \frac{\mu}{2} \frac{W}{L}}} (\sqrt{I_2} - \sqrt{I_1}). \qquad (\text{Eq. 5})$$

Assuming here that $I_3=(K+1)I_1$, then from Eq. 2, $$I_2 = K I_1 \qquad (\text{Eq. 6})$$

and thus the ratio of $I_3$ to $I_2(I_3/I_2)$ is $(K+1)/K$. (Eq. 7)

Substituting Eq. 6 into Eq. 5 results in:

$$\Delta V = \sqrt{\frac{I_1}{C_{ox} \frac{\mu}{2} \frac{W}{L}}} (\sqrt{K} - 1) \ldots , \qquad (\text{Eq. 8})$$

As stated above, the currents $I_3$ and $I_2$ are a function of (K+1) and $V_{ICONT}$, and K and $V_{ICONT}$, respectively. Because $I_1$ is the difference between currents $I_3$ and $I_2$ (Eq. 2), it follows that $I_1$ in this embodiment is approximately proportional to the square of the control signal $V_{ICONT}$. Thus, from Eq. 8:

$$\Delta V \propto V_{ICONT} \sqrt{C_{ox} \frac{\mu}{2} \frac{W}{L}} (\sqrt{K} - 1) \qquad (\text{Eq. 9})$$

Therefore, the voltage shift is a function of $V_{ICONT}$ and K. In this embodiment, $\Delta V$ is positive when the level shifter 100 reduces (more negative in this embodiment) the input signal's voltage, and $\Delta V$ is negative when the input signal's voltage is increased (more positive).

Optional voltage dropping resistor 112 may be used to improve the accuracy of the voltage shift by reducing the voltage from power supply node 114 so that the drain-to-source voltage of transistor 102 is similar to the drain-to-source voltage of transistor 106. As illustrated here, the power supply voltage on node 114 can be different from the power supply voltage on node 116 so that transistor 102 might be subject to less overvoltage stress when signals applied to input $V_{in}$ come from circuitry operating at a higher voltage than circuitry responsive to signals on output $V_{out}$.

Figure 2:
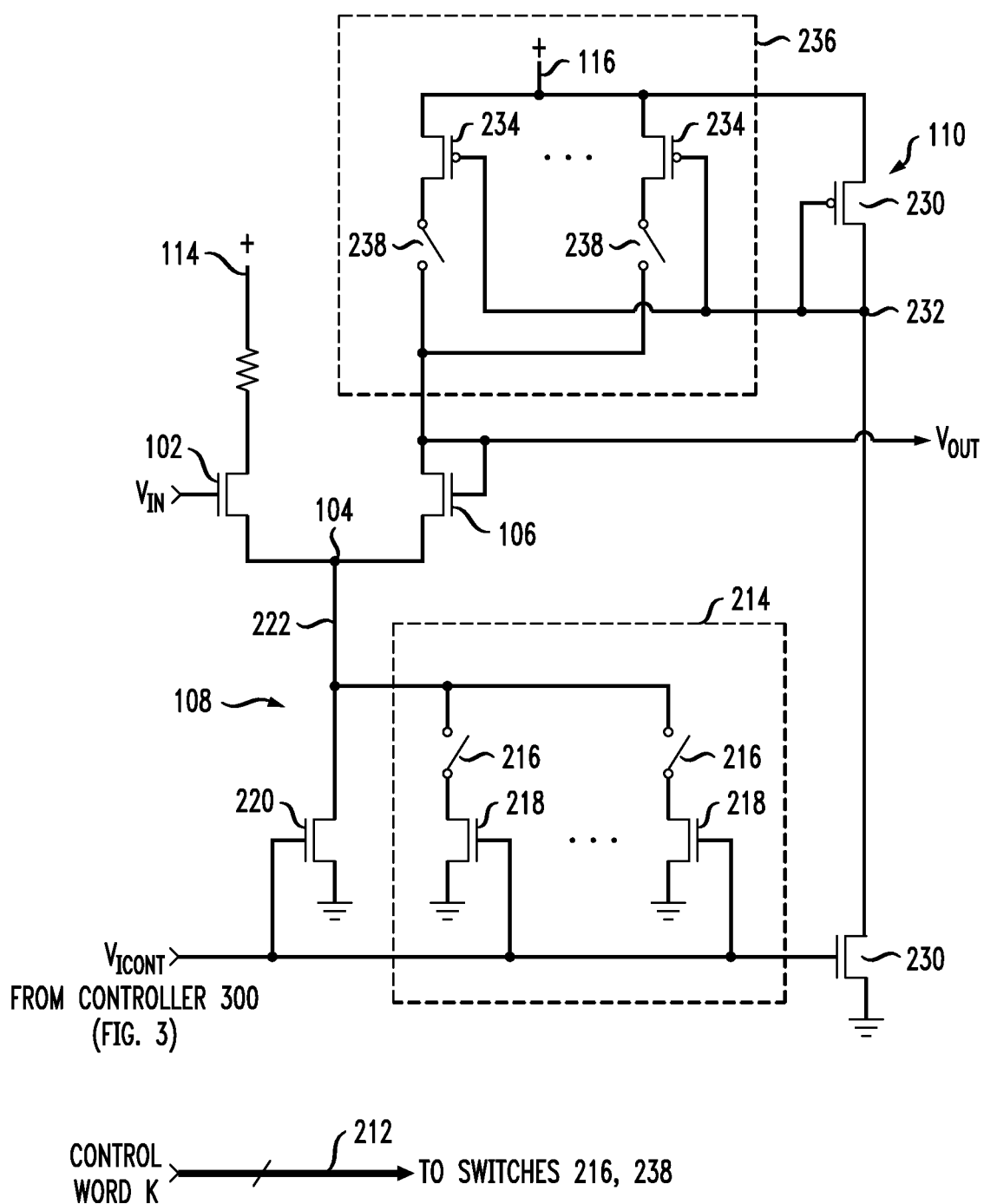
FIG. 2 is a simplified schematic diagram illustrating exemplary level translator according to another embodiment of the invention.

FIG. 2 is a simplified schematic diagram of another embodiment of a level shifter 200 illustrating a combined analog and digital control for the current sources 108 and 110 shown in FIG. 1. Identically numbered features in both figures are the same for both figures. In this embodiment, the scalar value K discussed above is specified by a digital control word on lines 212 and the currents generated by the sources in response to the common control signal $V_{ICONT}$ are scaled by K. Digitally-scaled current source 214 in controlled current source 108 receives the one or more bit control word K to selectively close switches 216 that couples the transistors 218 to node 104. The gates of transistors 218 are coupled to receive the common control signal $V_{ICONT}$. A transistor 220 also coupled to the node 104 and receives the common control signal $V_{ICONT}$. In this embodiment and for purposes of this description, the width-to-length ratio of transistor 220 is X and the width-to-length ratios of the transistors 218 are binary-weighted sequentially: X, 2X, 4X, etc., to implement the K+1 weighting for the current source 108 as discussed above. Other integer (e.g., X, 4X, 8X, etc.) and non-integer sequences might also be used. Further, the width-to-length ratios of transistors 102 and 106 might be designed to have different ratios, providing additional technique to determine ΔV.

Generally, the digitally scaled current source 214 passes a current that is a function of K and $V_{ICONT}$ as described above. In addition, the transistor 220 also passes a current that is a function of $V_{ICONT}$, such that the total current conducted by conductor 222, and hence by current source 108, is a function of (K+1) and $V_{ICONT}$.

Transistors 230 generate a control voltage on node 232 corresponding to the common control signal $V_{ICONT}$. That signal is coupled to the gates of transistors 234 of a digitally-scaled current source 236. As with digitally-scaled current source 214, the current source 236 receives the control word K to selectively close switches 238 that couples the transistors 234 to the drain and gate terminals of transistor 106. Thus, the digitally-scaled current source 236 produces a current to the transistor 106 that is a function of K and $V_{ICONT}$. By appropriately scaling the transistors 230 and 234 to the transistors 218 as is well known in the art, the currents passed by the current sources 214 and 236 will be substantially equal.

It is understood that the digitally-scaled current sources 214 and 236 may be implemented in a variety of ways, such as selectively coupling, in response to the control word K, the gates of the transistors 218 and 234 to their respective control signal instead of using the switches 216 and 238 as shown. Alternatively, the switches may be placed in series with the source terminals instead of the drain terminals of their respective transistors.

Figure 3:
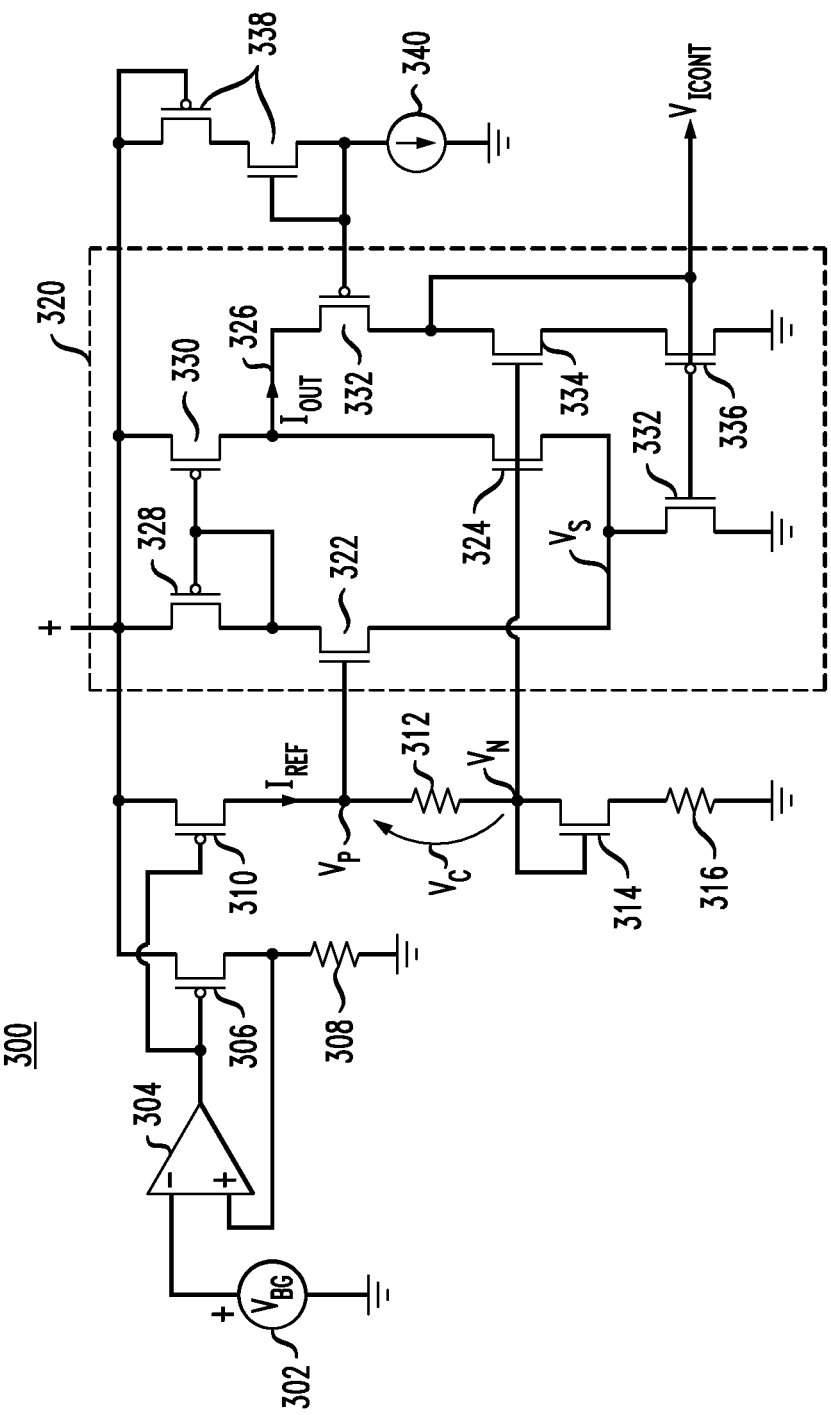
FIG. 3 is a simplified schematic diagram illustrating an exemplary control circuit for the level translators of FIGS. 1 and 2 according to an embodiment of the invention.

FIG. 3 illustrates an exemplary controller 300 for generating the common control signal $V_{ICONT}$ that is used to establish currents flowing in the current sources 108 and 110 (FIGS. 1 and 2). As will be explained below, those currents are proportional to the square of a reference voltage that is substantially independent of process, temperature, and power supply voltage. The controller 300 may be used in common with multiple level shifters 100, 200 as required.

A stabilized voltage reference 302, such as a conventional bandgap reference, provides a substantially constant voltage $V_{BG}$ that differential amplifier 304, transistor 306, and resistor 308 utilize in combination to establish a current passing through the resistor 308 of approximately $V_{BG}/R_{308}$, where $R_{308}$ is the resistance of resistor 308 which is located on the same semiconductor substrate as the rest of the circuitry shown in FIGS. 1-3. While the voltage $V_{BG}$ is stabilized over process, temperature, and power supply variations, $R_{308}$ is not. Transistor 310 mirrors the current flowing in transistor 306 and resistor 308 to produce a reference current $I_{ref}$. The current $I_{ref}$ passes through resistor 312 to produce a stabilized reference voltage $V_C$, diode-connected transistor 314, and resistor 316. Assuming that substantially equal currents flow in both transistors 306 and 310, then $V_C=V_P-V_N=V_{BG}(R_{312}/R_{308})$, where $R_{312}$ is the resistance of resistor 312. For purposes here, the transistor 314 and resistor 316 are used to provide adequate voltages to properly bias circuitry in a squaring circuit 320.

The voltage $V_C$ is stabilized over process and temperature because the ratio of the resistances of resistors 308 and 312 is substantially constant over process and temperature, so that the voltage $V_C$ is, for purposes here, invariant with changes in the resistors 308 and 312 but is proportional to $V_{BG}$ which is designed to be insensitive to process, temperature, and power supply voltage.

Circuitry 320, in response to the reference voltage $V_C$, generates the common control signal $V_{ICONT}$ so that the currents generated by the current sources 108 and 110 are proportional to the square of the stabilized reference voltage $V_C$.

In this embodiment, differentially-connected transistors 322 and 324 receive $V_C$ and produce an output current $I_{out}$ on line 326. Transistors 328 and 330 form a current mirror coupling to the drain terminals of transistors 322 and 324, respectively, while transistor 332 couple to the source terminals of the transistors 322 and 324. Transistors 332, 334, and 336 form a folded cascade current mirror to generate $V_{ICONT}$ in response to the output current $I_{out}$. In this embodiment, transistor 332 decouples the voltage of the control signal $V_{ICONT}$ from the drain voltages of transistors 324 and 330 so that the transistor 330 has sufficient drain voltage for saturated operation. By having transistor 334 approximately the same size as transistor 324 so that the $V_{gs}$ and $V_{ds}$ (drain-to-source voltage) of transistor 324 is approximately the same as the $V_{gs}$ and $V_{ds}$ of transistor 334, transistor 334 improves the performance of the current mirror of transistors 332 and 336 so that current passed by transistor 332 tracks the current $I_{out}$ more closely than without transistor 334.

A bias circuit comprising transistors 338 and current source 340 provides the appropriate bias voltage to the gate of transistor 332 so that the transistor 330 has sufficient drain voltage for saturated operation.

As will be explained in more detail below, by making the size of transistor 328 twice the size of transistor 330, and the width-to-length of transistor 332 five times that of each of the substantially identical transistors 322, 324, 334, and 336, approximately twice the output current $I_{out}$ will flow through transistor 330, four times the output current $I_{out}$ will flow through transistor 328, and five time the output current $I_{out}$ will flow through transistor 332. In this way, the output current $I_{out}$ will be approximately equal to $$\sqrt{C_{ox}\frac{\mu}{2}\frac{W}{L}}(V_C)^2,$$

where the values of $C_{ox}$, $\mu$, and $$\frac{W}{L},$$

as defined above, are those for each of the substantially identical transistors 322, 324, 334, and 336. Because $I_{out}$ will have this characteristic, then currents in the current sources 108 and 110 (FIGS. 1 and 2) will be proportional to the square of $V_C$. The result, per Eq. 8, is that the voltage offset or shift ΔV by the level shifter 100 (FIG. 1) or 200 (FIG. 2) is proportional to the reference voltage $V_C$ and can be accurately controlled thereby.

As mentioned above, transistor 314 and resistor 316 are used to set an appropriate gate voltage for transistor 324 so that both transistors 324 and 332 are saturated. In this example, resistor 316 has about 200 mV across it and transistor 314 is sized to have a similar width-to-length ratio as transistor 324 so that the Vgs of transistor 314 is approximately the same as the $V_{gs}$ of transistor 324.

The operation of the circuit 320 is as follows. As stated above, in one embodiment, the width-to-length ratio of transistor 332 five times that of transistor 336, the width-to-length ratio of transistor 328 is approximately twice that of transistor 330, and the width-to-length ratio of transistor 322 is approximately the same as that of transistors 324 and 334. Because of the sizing of the transistors, the current passed by or flowing in transistor 332 ($I_{332}$) is approximately five time the output current $I_{out}$ (which is equal to the current passed by transistors 332-336) and the current flowing in transistor 328 ($I_{328}$) is twice that passed by current mirror transistor 330 ($I_{330}$). It then follows that:

$$I_{328}+I_{330}=I_{out}+I_{332} \quad \text{(Eq. 10)}$$

Because transistor 328 carries twice the current of transistor 330, and transistor 332 carries five times the current passed by transistor 336 ($I_{out}$), then:

$$2I_{330}+I_{330}=I_{out}+5I_{out}=6I_{out}, \text{ and} \quad \text{(Eq. 11)}$$

$$I_{330}=2I_{out} \text{ and,} \quad \text{(Eq. 12)}$$

$$I_{328}=I_{322}=4I_{out} \quad \text{(Eq. 13)}$$

The current flowing in transistor 324 ($I_{324}$) is then calculated to be:

$$I_{324}=I_{320}-I_{336}=2I_{out}-I_{out}=I_{out} \quad \text{(Eq. 14)}$$

Expressing Eq. 1 for the current passed by transistor 322 according to Eq. 13 yields:

$$4I_{out} = C_{ox}\frac{\mu}{2}\frac{W}{L}(V_P - V_S - V_{th})^2 \quad \text{(Eq. 15)}$$

and expressing Eq. 1 for the current passed by transistor 324 according to Eq. 14 yields:

$$I_{out} = C_{ox}\frac{\mu}{2}\frac{W}{L}(V_N - V_S - V_{th})^2. \quad \text{(Eq. 16)}$$

Solving Eq. 15 for gate-to-source voltage of transistor 322 yields:

$$\sqrt{\frac{4I_{out}}{C_{ox}\frac{\mu}{2}\frac{W}{L}}} = V_P - V_S - V_{th} \quad \text{(Eq. 17)}$$

and solving Eq. 16 for the gate-to-source voltage of transistor 324 yields:

$$\sqrt{\frac{I_{out}}{C_{ox}\frac{\mu}{2}\frac{W}{L}}} = V_N - V_S - V_{th}. \quad \text{(Eq. 18)}$$

Subtracting Eq. 18 from Eq. 17 yields:

$$\sqrt{\frac{I_{out}}{C_{ox}\frac{\mu}{2}\frac{W}{L}}} = V_P - V_N = V_C \quad \text{(Eq. 19)}$$

and solving Eq. 19 for $I_{out}$ yields:

$$I_{out} = C_{ox}\frac{\mu}{2}\frac{W}{L}(V_P - V_N)^2 = C_{ox}\frac{\mu}{2}\frac{W}{L}V_C^2. \quad \text{(Eq. 20)}$$

Because $V_{ICONT}$ controls both $I_{out}$ and the currents passed current sources 108 and 110 (FIGS. 1 and 2) and that $I_{out}$ is approximately equal to $$\sqrt{C_{ox}\frac{\mu}{2}\frac{W}{L}}(V_C)^2,$$

then currents passed by the current sources 108 and 110 (FIGS. 1 and 2) will be proportional to the square of $V_C$. As a result and per Eq. 8, the voltage offset or shift $\Delta V$ by the level shifter 100 (FIG. 1) or 200 (FIG. 2) is proportional to the reference voltage $V_C$:

$$\Delta V \propto V_C(\sqrt{K}-1). \quad \text{(Eq. 21)}$$

Thus $\Delta V$ can be be scaled to $V_C$ by correspondingly scaling the width-to-length ratios of the transistors in the current sources 108, 110 to that of transistor 336. However, for the case where $I_{out}=I_1$ (FIG. 1), $$\Delta V = V_C(\sqrt{K}-1). \quad \text{(Eq. 22)}$$

Because $V_C$ is set by $V_{BG}$, then $\Delta V$ is accurately controlled. As is well known in the art, a conventional start-up circuit (not shown) is added to the circuit 320 to insure that the circuit 320 operates upon applying power thereto.

Figure 4:
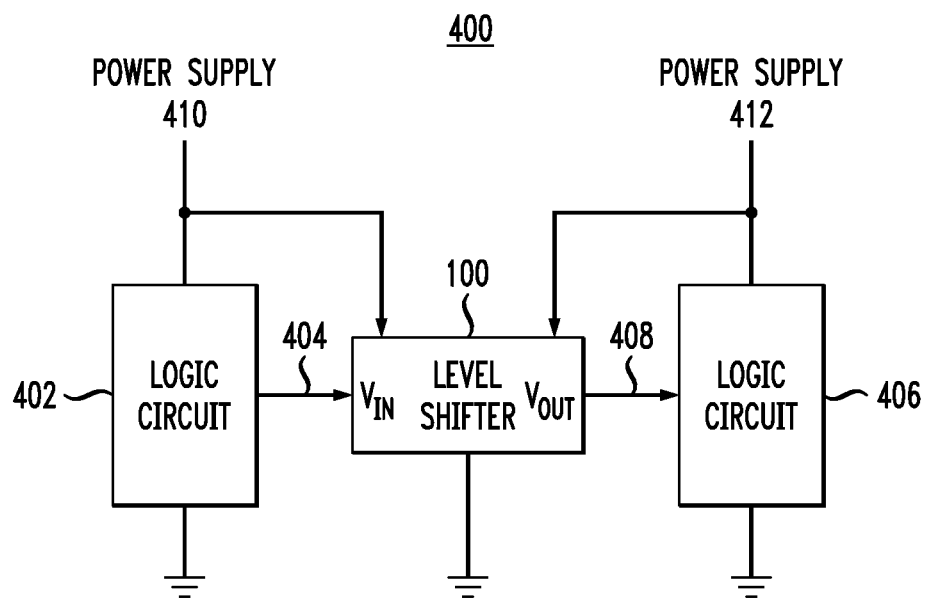
FIG. 4 shows a block diagram of a logic device incorporating the level translator of FIGS. 1 and 2.

FIG. 4 is a simplified block diagram of an exemplary logic device 400, such as a field-programmable gate array (FPGA), integrated into a common substrate or chip and having at least two logic circuit blocks. Each of the logic blocks being powered by it own power supply or power domain and using one or more of the above-described level shifters to translate or shift the voltage levels of logic signals from the first logic block to the second logic block. In this exemplary embodiment, a first logic circuit block 402 produces one or more logic signals on leads 404 and a second logic block 406 receives logic signals over leads 408. In this example, the logic circuit 402 is powered from a power supply 410 and logic circuit 406 is powered from a power supply 412, the voltage of power supply 410 being greater than that of power supply 412. Because logic signal voltage levels are generally proportional to the power supply voltage of the logic circuitry generating the logic signals, in this example the logic signals on leads 404 have a voltage greater than the logic circuitry 406 can reliably or safely handle. To provide the desired logic levels to logic circuitry 406, one or more level shifters 100, such as that shown in FIG. 1 or FIG. 2, shift the logic level voltages of logic signals on leads 404 to acceptable logic level voltages on leads 408 for logic circuitry 406 to process. Here, the level shifters 100 couple to both power supplies 410 and 412. Referring temporarily to FIG. 1, the power supply node 114 couples to power supply 410 and the power supply node 116 couples to power supply 412. This allows transistor 102 to sustain the higher voltage logic signals on leads 404 without undue stress compared to having power supply nodes 114 and 116 coupled to the same, lower voltage power supply 412. In this case, the resistor 112 might not be needed. However, it is understood that both power supply nodes 114 and 116 may be connected to either power supply as appropriate and that the voltage on node 116 can be greater than that on node 114.

While the controller 300 in FIG. 3 is not shown, one or more of the controllers might be provided on the same chip as the FPGA circuitry 400. The digital control word K might be supplied by logic circuit block 402, 404, or other logic (not shown).

Figure 5:
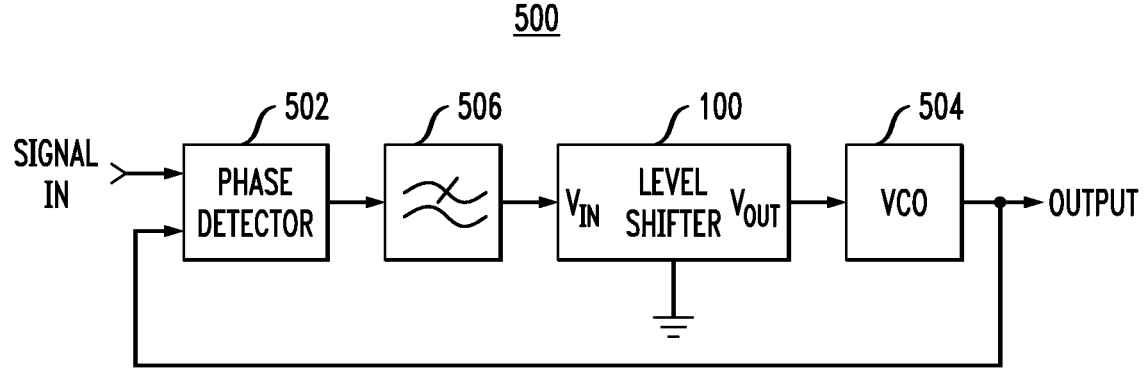
FIG. 5 shows a simplified block diagram of an analog function (a phase-locked-loop) incorporating the level translator of FIGS. 1 and 2.

FIG. 5 is a simplified block diagram of an analog function 500, here a phase-locked-loop (PLL), using the above-described level shifter to translate or shift the voltage levels of signals from one sub-block of the PLL to another sub-block of the PLL. In this exemplary embodiment of an analog function, a phase comparator 502 compares an input signal to the output signal of a voltage-controlled oscillator 504. An error signal representing the phase difference between the input signal and the VCO output signal is filtered by low-pass filter 506. Because the voltage level of signals from the filter 506 might be out of the range of the control signal to the VCO 504, the level shifter 100, such as that of FIG. 1 or FIG. 2, translates the signal to a range usable by the VCO 504. Moreover, by precisely controlling the amount of voltage shift, the level shifter 100 may be used to precisely shift the phase of the VCO output signal while the PLL is locked.

In this example, the level shifter 100 is powered by one power supply (not shown). However, as is common in many modern analog designs, the VCO 504 is powered from a different power supply as the rest of the circuitry to reduce jitter and other noise from appearing in the output signal from the VCO. In this case, the level shifter 100 may be powered from two different power sources, one for the phase detector 502 and the filter 506, and one for the VCO 504, similar to how the level shifter 100 is powered in FIG. 4.

While the controller 300 in FIG. 3 is not shown, one or more of the controllers might be provided on the same chip as the analog function 500. The digital control word K might be supplied by logic circuitry either on the same chip as the function 500 or external to the chip.

It is understood that various changes in the details, materials, and arrangements of the parts which have been described and illustrated in order to explain the nature of this invention might be made by those skilled in the art without departing from the scope of the invention as expressed in the following claims.

We claim:

1. A level shifting circuit comprising:
a first transistor having a control terminal coupled to an input terminal of the level shifting circuit, a first controlled terminal, and a second controlled terminal coupled to a first node;
a second transistor having a first controlled terminal coupled to an output terminal of the level shifting circuit, a second controlled terminal coupled to the first node, and a control terminal coupled to the first controlled terminal of the second transistor;
a first controlled current source coupled to the first node; and
a second controlled current source coupled to the first controlled terminal of the second transistor;
wherein current from the first controlled current source and current from the second controlled current source are substantially independent of signals applied to the input terminal.

2. The level shifter of claim 1 wherein the first and second transistors have substantially equal width-to-length ratios and signals on the output terminal are shifted in voltage from signals applied to the input terminal the amount of voltage shift being controlled by the amount of current from the first and second current sources.

3. The level shifter of claim 2 wherein a ratio of the currents from the first and second controlled current sources is substantially equal to (K+1)/K, where K is greater than zero.

4. The level shifter of claim 3 wherein the first and second controlled current sources each comprise a plurality of switchable current mirror transistors, each of the switchable current mirror transistors being coupled to a common control signal.

5. The level shifter of claim 1 wherein the first and second transistors have different width-to-length ratios and signals on the output terminal are shifted in voltage from signals applied to the input terminal and the amount of voltage shift being controlled by a ratio of the currents from the first and second controlled current sources scaled a ratio of the width-to-length ratios of the first transistor to the second transistor.

6. The level shifter of claim 1 further comprising:
a controller, including a bandgap reference and a reference resistor, for adjusting the currents passed by the first and second current sources.

7. The level shifter of claim 6 wherein the controller comprises:
a voltage-to-current generating circuit coupling to the bandgap reference and the reference resistor and adapted to generate a reference current;
a first resistor receiving the reference current and adapted to generate a first voltage signal; and
a squaring circuit, having an input coupled to the first resistor, adapted to generate a control signal proportional to the first voltage signal squared;
wherein the first and second current sources are responsive to the control signal.

8. The level shifter of claim 6 wherein the level shifter, the reference resistor, and the first resister are fabricated in a common integrated circuit.

9. The level shifter of claim wherein the second transistor is a diode-connected MOSFET.

10. The level shifter of claim 1 further comprising a dropping resistor coupled between a power supply node and the first controlled terminal of the first transistor.

11. An integrated circuit comprising:
a first logic circuit coupled between ground and a first power supply domain;
a second logic block coupled between ground and a second power supply domain; and
at least one level shifter according to claim 1;
wherein, for at least one of the level shifters, the input terminal is coupled to the first logic circuit, the output terminal is coupled to the second logic circuit, and the first controlled terminal of the first transistor is coupled to the first power supply domain.

12. The integrated circuit of claim 11 wherein for the at least one level shifter, the first current source is coupled between ground and the first node, and the second current source is coupled between the second power supply domain and the first controlled node of the second transistor.

13. An integrated circuit comprising:
a first analog function circuit;
a second analog function circuit; and
at least one level shifter according to claim 1;
wherein, for at least one of the level shifters, the input terminal is coupled to the first analog function circuit, and the output terminal is coupled to the second analog function circuit.

14. A level shifting circuit comprising: a first transistor, configured as a voltage follower, having a control terminal coupled to an input terminal of the circuit and to a node; a diode connected transistor coupled between the node and an output terminal of the circuit; a first controlled current source coupled to the node; a second controlled current source coupled to the output terminal; wherein current from the first controlled current source and current from the second controlled current source are substantially independent of signals applied to the input terminal.

15. The level shifting circuit of claim 14 wherein the first and second controlled current sources each comprise a plurality of switchable current mirror transistors, each of the switchable current mirror transistors being coupled to a common control signal.

16. A level shifting circuit comprising:
- a first transistor having a control terminal coupled to an input terminal of the level shifting circuit, a first controlled terminal, and a second controlled terminal coupled to a first node;
- a second transistor having a first controlled terminal coupled to an output terminal of the level shifting circuit, a second controlled terminal coupled to the first node, and a control terminal coupled to the first controlled terminal of the second transistor;
- a first controlled current source coupled to the first node; and
- a second controlled current source coupled to the first controlled terminal of the second transistor;
- wherein the first and second transistors have substantially equal width-to-length ratios and signals on the output terminal are shifted in voltage from signals applied to the input terminal the amount of voltage shift being controlled by the amount of current from the first and second controlled current sources.

17. The level shifting circuit of claim 16 wherein a ratio of the currents from the first and second controlled current sources is substantially equal to (K+1)/K, where K is greater than zero.

18. The level shifting circuit of claim 16 further comprising:
- a controller, including a bandgap reference and a reference resistor, for adjusting the currents passed by the first and second current sources.

19. The level shifting circuit of claim 16, wherein the level shifting circuit is fabricated as part of an integrated circuit.

* * * * *